United States Patent [19]
Tabuchi

[11] Patent Number: 5,550,698
[45] Date of Patent: Aug. 27, 1996

[54] SEMICONDUCTOR DEVICE

[75] Inventor: Masayuki Tabuchi, Itami, Japan

[73] Assignee: Mitsubishi Denki Kabushiki Kaisha, Tokyo, Japan

[21] Appl. No.: 767,481

[22] Filed: Sep. 30, 1991

[30] Foreign Application Priority Data

Oct. 5, 1990 [JP] Japan .................................. 2-105355

[51] Int. Cl.$^6$ .................................................. H01L 29/00
[52] U.S. Cl. ........................... 361/56; 361/91; 361/111; 361/118
[58] Field of Search .......................... 361/91, 111, 118, 361/119, 56

[56] References Cited

U.S. PATENT DOCUMENTS 4,291,319  9/1981  Carinalli ................................ 361/111

*Primary Examiner*—Jeffrey A. Gaffin
*Assistant Examiner*—Stephen W. Jackson
*Attorney, Agent, or Firm*—Oblon, Spivak, McClelland, Maier & Neustadt, P.C.

[57]  ABSTRACT

In a semiconductor device, impurity density at a base region of a protection transistor (9) is lower than impurity density at base regions of transistors (1, 2) which constitute a Darlington transistor (100). With high voltage impressed on a first output terminal (6), the protection transistor (9) first turns on because the impurity density at its base region is the lowest. Current thus allowed into the protection transistor (9) is amplified at the Darlington transistor (100) so that current equivalent to the amplified current is pulled out from current flowing in the output terminal (6). As a result, the first output terminal (6) is freed from high voltage impressed thereupon. The protection transistor (9) is obtainable in a process for forming the transistors (1, 2) by only lowering impurity density of the protection transistor (9) at the base region, thus omitting a special step for forming the protection transistor (9). Hence, cost for fabricating the semiconductor device is reduced.

4 Claims, 2 Drawing Sheets 5,550,698

SEMICONDUCTOR DEVICE

BACKGROUND OF THE INVENTION

1. Field of the Invention

The present invention relates to a semiconductor device employing a Darlington transistor used within an ignition device for an automobile.

2. Description of the Prior Art

FIG. 1 is a circuit diagram of a conventional semiconductor device including a Darlington transistor for use within an ignition device for an automobile. In the semiconductor device, a Darlington power transistor 100 is constituted by NPN transistors 1 and 2. The transistor 1 has a collector connected to a first output terminal 6 and an emitter connected to a second output terminal 7. The transistor 2 has a collector connected to the first output terminal 6, an emitter connected to a base of the transistor 1 and a base connected to an input terminal 5.

Also connected to the first output terminal 6 is one end of an ignition coil 200, the another end of the ignition coil 200 being connected to an ignition plug (not shown) mounted within an engine room. Between the base and the emitter of the transistor 1 is interposed a resistor 3. Likewise, a resistor 4 is inserted between the base and the emitter of the transistor 2. A control circuit 300 is for generating a pulse signal 20 in response to a signal received at a signal input terminal 30, the pulse signal 20 being to be given to the input terminal 5. Another resistor 10 is interposed between the second output terminal 7 and a ground to restrict current flow into the transistor 1.

An avalanche diode 8, with a cathode connected to the first output terminal 6 and an anode connected to the base of the transistor 2, protects the Darlington transistor 100 against breakage if high voltage is impressed on the first output terminal 6.

Now, operations of the conventional semiconductor device will be explained. Provided with a signal received at the signal input terminal 30, the control circuit 300 generates a pulse signal 20 for turning the Darlington transistor 100 on and off. In response to the pulse signal 20 given at the input terminal 5, the Darlington transistor 100 turns on or off. Shift in the Darlington transistor 100 from conductive state to non-conductive state gives rise to high voltage at the ignition coil 200. Supplied with the generated high voltage, the ignition plug (not shown) installed in the engine room sparkles, whereby fuel in an engine explodes and the engine starts up.

The high voltage generated at the ignition coil 200 is impressed on the first output terminal 6 as well, so that the avalanche diode 8 turns on. Current thus allowed to the avalanche diode 8 flows into the transistor 2 where it becomes base current which is amplified thereat. The current amplified at the transistor 2 is next given to the base of the transistor 1. The transistor 1 further amplifies the current so that current equivalent to the current amplified at the transistor 1 is pulled out from current flowing in the first output terminal 6. As a result, the first output terminal 6 is freed from high voltage impressed thereupon, which in turn prevents the Darlington transistor 100 from breakage. Thus, owing to the structure that current flowing in the avalanche diode 8 is amplified at the transistors 1 and 2, the conventional semiconductor device is advantageous in that reduction of the avalanche diode 8 in size is possible.

As heretofore described, the conventional semicondutor device for an ignition device protects the Darlington transistor 100 against breakage by means of the avalanche diode 8. However, this approach has a problem. If the avalanche diode 8 is formed by a collector-base junction of a transistor, high avalanche voltage would result at the avalanche diode 8, whereby the avalanche diode 8 would not be able to play its role of protecting the Darlington transistor 100 against breakage. Hence, in order to obtain an avalanche diode 8 at which avalanche voltage is low, fabrication of the conventional semiconductor device must include one more diffusion step in addition to a diffusion step for forming the transistors 1 and 2. Thus, the semiconductor device becomes expensive.

SUMMARY OF THE INVENTION

The present invention is applicable to a semiconductor device connected with a high voltage coil, which generates high voltage at the high voltage generation coil by blocking current flowing through it.

In the first aspect, a semiconductor device of the present invention comprises an input terminal; a first output terminal and a second output terminal; a Darlington transistor for controlling current flowing through said high voltage generation coil, a base of said Darlington transistor being connected said input terminal, a collector of said Darlington transistor being connected to said first output terminal and an emitter of said Darlington transistor being connected to said second output terminal; and a protection transistor for protecting said Darlington transistor against breakage by causing short circuit between a collector and an emitter thereof when high voltage is impressed on the collector of said protection transistor, said emitter thereof being connected to said input terminal and said collector thereof being connected to said first output terminal.

Thus, differently from a conventional semiconductor device, the semiconductor device as above according to the present invention does not require an avalanche diode since it comprises the protection transistor which protects the Darlington transistor against breakage by causing short circuit between the collector and the emitter thereof when high voltage is impressed on the collector of the Darlington transistor. Therefore, it is unnecessary to provide the step of forming an avalanche diode, so that cost for fabricating the semiconductor device can be reduced.

In the second aspect, a semiconductor device according to the present invention comprises an input terminal; a first output terminal and a second output terminal; a Darlington transistor for controlling current flowing through said high voltage generation coil, a base of said Darlington transistor being connected said input terminal, a collector of said Darlington transistor being connected to said first output terminal and an emitter of said Darlington transistor being connected to said second output terminal; and a protection transistor having an emitter connected to said input terminal and a collector connected to said first output terminal. A characteristic of the semiconductor device according to another embodiment resides in that impurity density at the base region of said protection transistor is lower than impurity density at the base regions of transistors which constitute said Darlington transistor.

Thus, differently from a conventional semiconductor device, the semiconductor device as above according to the present invention does not require an avalanche diode since impurity density at the base region of the protection transistor is lower than impurity density at the base regions of transistors which constitute the Darlington transistor. Therefore, it is unnecessary to provide the step of forming an avalanche diode, so that cost for fabricating the semiconductor device can be reduced.

Therefore, an object of the present invention is to obtain a semiconductor device which is fabricated at reduced manufacturing cost by eliminating necessity of providing an avalanche diode.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
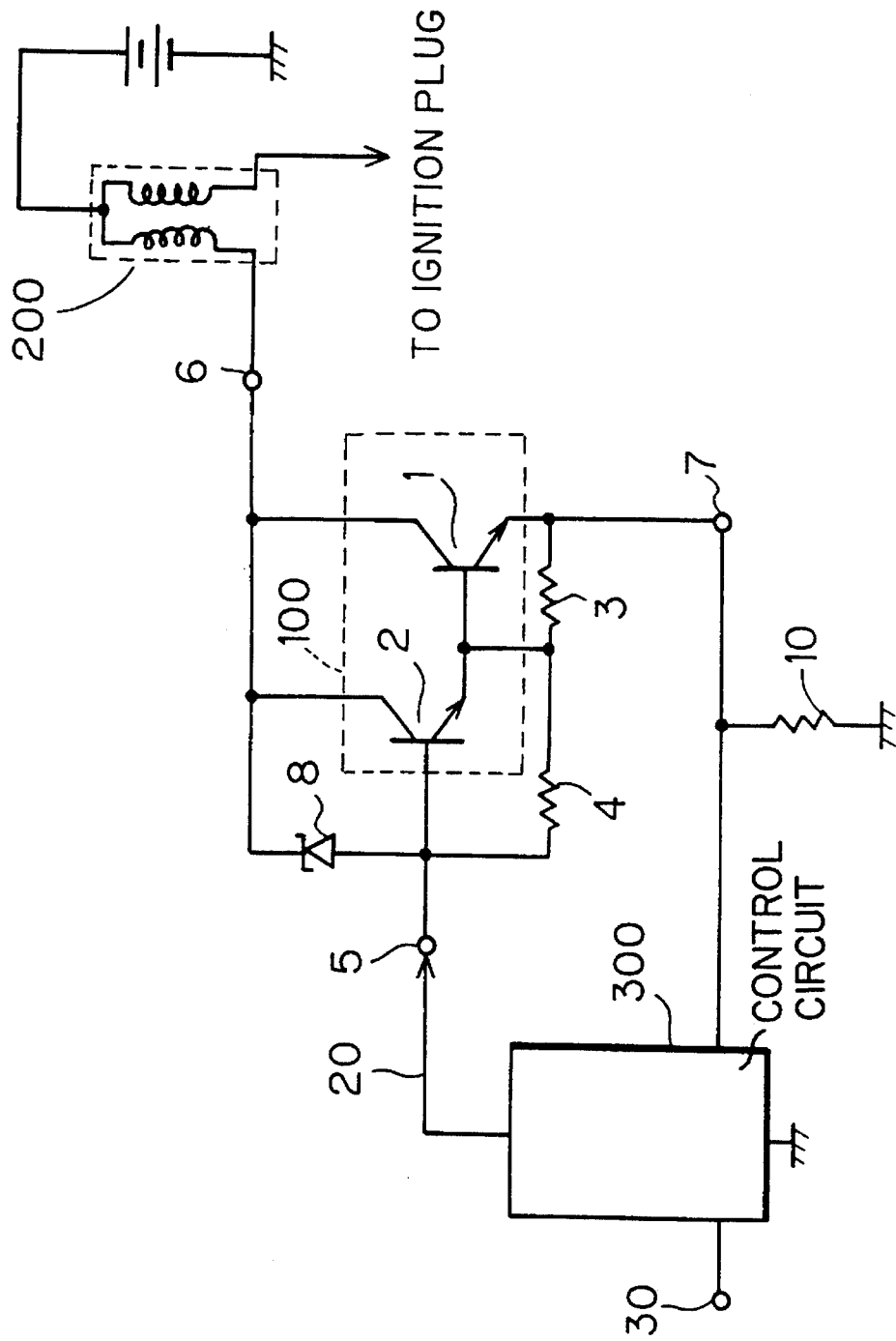
FIG. 1 is a circuit diagram of a conventional semiconductor device for an ignition device.
Figure 2:
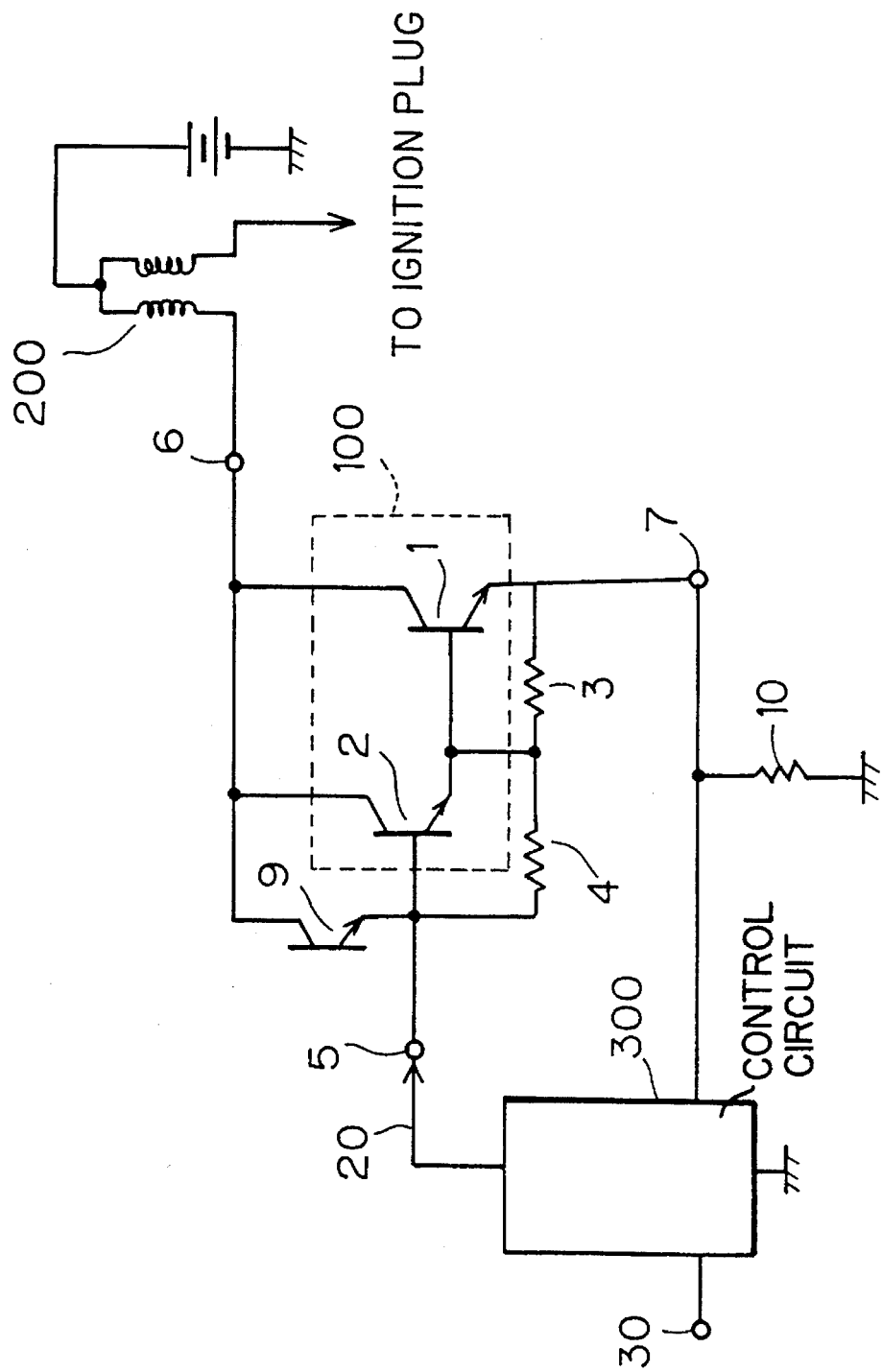
FIG. 2 is a circuit diagram of a semiconductor device according to an embodiment of the present invention.

FIG. 2 is a circuit diagram of a semiconductor device according to an embodiment of the present invention. The semiconductor device shown in FIG. 2 is generally the same as the conventional semiconductor device of FIG. 1 except that it comprises a protection NPN transistor 9 instead of an avalanche diode 8. The protection transistor 9 has a collector connected to a first output terminal 6 and an emitter connected to an input terminal 5. Impurity density in a base region of the protection transistor 9 is lower than corresponding impurity density in transistors 1 and 2. Hence, collector-emitter yielding voltage $V_{CE09}$ of the protection transistor 9 is lower than corresponding yielding voltage $V_{CE01}$ of the transistor 1 as well as corresponding yielding voltage $V_{CE02}$ of the transistor 2. The novel semiconductor device is otherwise the same as the conventional semiconductor device.

Now, the novel semiconductor device will be described as to operations. When a Darlington transistor 100 shifts from conductive state to non-conductive state, high voltage is generated at an ignition coil 200 and impressed on the first output terminal 6, which is similar to what happens in the conventional semiconductor device. Subsequently, current from the first output terminal 6 flows into a transistor which has the lowest breakdown voltage, namely, the protection transistor 9. This is because impurity density of the protection transistor 9 at the base region is lower than impurity density of the transistors 1 and 2 at the base regions. More precisely, transistors generally satisfy the relations below:

$$h_{FE} \propto 1/N_B$$

$$V_{CE0} \propto V_{CB0}/(n\sqrt{h_{FE}})$$

where $h_{FE}$ is an amplification rate of direct current, $V_{CB0}$ is yielding voltage between collector and base, $V_{CE0}$ is yielding voltage between collector and emitter, and $N_B$ is impurity density at a base region. By thus allotting low impurity density to the base region, the protection transistor 9 satisfies a requirement for high DC amplification rate $h_{FE}$, i.e., low collector-emitter yielding voltage $V_{CE0}$.

The current into the protection transistor 9, which was caused by high voltage impressed on the first output terminal 6, further flows into the transistors 2 and 1 where it is amplified, whereby current at the transistor 1 is $h_{FE} \cdot h_{FE}$ times larger than current at the transistor 9. Consequently, the current increased by $h_{FE} \cdot h_{FE}$ times is pulled out from the first output terminal 6. Thus, without high voltage onto the first output terminal 6, the Darlington transistor 100 would not break down. In addition, the protection transistor 9 can be extremely small since it is required to have current capacity merely $1/(h_{FE} \cdot h_{FE})$ times small that of the Darlington transistor 100. Moreover, the protection transistor 9 can be formed in the same process for forming the transistors 1 and 2 only by changing impurity density in diffusion for the base region.

Although the heretofore has described the novel semiconductor device while focusing on application to an ignition device for an automobile, the present invention has a wider field of application. Within the applicable field of the present invention is every kinds of semiconductor devices that are generally aimed at generating high voltage at a high voltage generation coil by blocking current flow thereinto.

While the invention has been shown and described in detail, the foregoing description is in all aspects illustrative and not restrictive. It is understood that numerous modifications and variations can be devised without departing from the scope of the invention.

I claim:

1. A semiconductor device connected with a high voltage generation coil, for generating high voltage at said high voltage generation coil by blocking current flowing through said high voltage generation coil, comprising:

an input terminal;

a first output terminal and a second output terminal;

a Darlington transistor for controlling current flowing through said high voltage generation coil, a base of said Darlington transistor being connected said input terminal, a collector of said Darlington transistor being connected to said first output terminal and an emitter of said Darlington transistor being connected to said second output terminal; and a protection transistor having an emitter connected to said input terminal and a collector connected to said first output terminal, the impurity density at the base region of said protection transistor being lower than impurity density at the base regions of transistors which constitute said Darlington transistor.

2. A semiconductor device in accordance with claim 1, wherein said Darlington transistor is formed by:

a first NPN transistor having a base connected to said input terminal and a collector connected to said first output terminal; and a second NPN transistor having a base connected to an emitter of said first NPN transistor, a collector connected to said first output terminal and an emitter connected to said second output terminal.

3. A semiconductor device in accordance with claim 1, wherein said semiconductor device is for use especially within an ignition device for an automobile and said high voltage generation coil is an ignition coil.

4. A semiconductor device in accordance with claim 2, further comprising:

a first resistor interposed between the emitter and the base of said first NPN transistor; and a second resistor interposed between the emitter and the base of said second NPN transistor.

* * * * *